(12) United States Patent
Povall et al.

(10) Patent No.: US 7,004,234 B2
(45) Date of Patent: Feb. 28, 2006

(54) VAPORIZER FOR GENERATING FEED GAS FOR AN ARC CHAMBER

(75) Inventors: Simon Povall, West Sussex (GB); David Richard Burgin, West Sussex (GB); John Pontefract, East Sussex (GB); Michael J. King, West Sussex (GB)

(73) Assignee: Applied Materials, Inc., Santa Clara, CA (US)

(*) Notice: Subject to any disclaimer, the term of this patent is extended or adjusted under 35 U.S.C. 154(b) by 261 days.

(21) Appl. No.: 10/397,234

(22) Filed: Mar. 27, 2003

(65) Prior Publication Data

US 2003/0183172 A1    Oct. 2, 2003

Related U.S. Application Data

(62) Division of application No. 09/825,365, filed on Apr. 4, 2001, now abandoned.

(30) Foreign Application Priority Data

Apr. 4, 2000    (GB) .................................. 0008286

(51) Int. Cl.
  *F25B 29/00*    (2006.01)
(52) U.S. Cl. ......................... 165/58; 165/61; 392/389
(58) Field of Classification Search ................. 165/58, 165/61; 392/388, 389; 118/724, 726, 727
  See application file for complete search history.

(56) References Cited

U.S. PATENT DOCUMENTS

| | | |
|---|---|---|
| 2,433,495 A | 12/1947 | Vogel |
| 3,620,522 A | 11/1971 | Bridges |
| 3,649,862 A * | 3/1972 | Wahlin .................... 313/361.1 |
| 3,935,412 A | 1/1976 | McDonough et al. |
| 4,016,389 A | 4/1977 | White |
| 4,115,163 A | 9/1978 | Gorina et al. |
| 4,462,463 A | 7/1984 | Gorham |
| 4,719,355 A | 1/1988 | Meyers et al. |
| 4,847,469 A | 7/1989 | Hofmann et al. |
| 4,944,246 A | 7/1990 | Tanaka et al. |

(Continued)

FOREIGN PATENT DOCUMENTS

| | | |
|---|---|---|
| EP | 0304201 | 2/1989 |
| GB | 1329895 | 9/1973 |
| JP | 62-235466 | 10/1987 |
| JP | 03294720 A | 12/1991 |
| JP | 6010118 | 1/1994 |
| JP | 11063485 A | 3/1999 |

*Primary Examiner*—Teresa J. Walberg
(74) *Attorney, Agent, or Firm*—Boult Wade Tennant

(57) ABSTRACT

A vaporizer generating feed gas for the arc chamber of an ion source has a crucible which is heated to a temperature at which material in the crucible sublimes to produce a vapour for use as the feed gas. In addition to the heating element for heating the crucible, there is a cooling element in the form of a cooling duct extending along the length of the crucible for receiving the cooling fluid. Forced cooling of the crucible when the heating element is switched off enables the crucible to be cooled more quickly so that the supply of a feed gas can be terminated sooner. This is important if an ion source is being switched from one feed gas to another. Also, the crucible may be forced cooled simultaneously while energizing the heating element to enable the crucible to be accurately controlled at a lower operating temperature if desired.

1 Claim, 1 Drawing Sheet

U.S. PATENT DOCUMENTS

| | | |
|---|---|---|
| 5,228,505 A | 7/1993 | Dempsey |
| 5,598,709 A | 2/1997 | Viegas et al. |
| 5,604,350 A | 2/1997 | Chu |
| 6,021,582 A | 2/2000 | Wing |
| 6,107,634 A | 8/2000 | Horsky et al. |
| 6,162,300 A * | 12/2000 | Bichrt ........................ 118/726 |
| 6,744,214 B1 * | 6/2004 | Horsky .................. 315/111.81 |
| 2001/0011524 A1 * | 8/2001 | Witzman et al. ............ 118/726 |

* cited by examiner

VAPORIZER FOR GENERATING FEED GAS FOR AN ARC CHAMBER

This application is a divisional of Application Ser. No. 09/825,365, filed on Apr. 4, 2001 ABN, the entire contents of which are hereby incorporated by reference and for which priority is claimed under 35 U.S.C. § 120; and this application claims priority of Application No. 0008286.7 filed in United Kingdom on Apr. 4, 2000, under 35 U.S.C. § 119.

FIELD OF THE INVENTION

The present invention relates to a vaporiser for generating feed gas for an arc chamber. The invention is particularly applicable when the arc chamber acts as the ion source for a semiconductor implant apparatus.

BACKGROUND OF THE INVENTION

Such a vaporiser typically comprises an elongate crucible arranged to contain a source of material, and a heater to heat the source to generate the feed gas. Typically, two such vaporisers are provided in a semiconductor implant apparatus, each containing a different source of material for generating different species of feed gas. In order to switch between feed gases, it is necessary to disconnect the power supply to the heater and allow the source to cool thereby ceasing the production of feed gas. The arc chamber is then purged before the heater of the second vaporiser is activated in order to commence the supply of the second feed gas. Usually, the vaporiser is allowed to cool by radiation, but in one prior art attempt to improve the cooling, a jet of $N_2$ is directed at the end of the crucible on the atmospheric side. This improves the cooling to some extent, but does little to cool the source of material at the far end of the crucible.

A further problem is that although vaporisers used in the prior art operate well at or close to their maximum temperatures, it is sometimes necessary to operate vaporisers at a lower temperature. Control of conventional vaporisers at this lower temperature has proved to be difficult as the vaporiser is particularly sensitive to sudden power surges to the heater.

SUMMARY OF THE INVENTION

According to the present invention there is provided a vaporiser for generating feed gas for an arc chamber, the vaporiser comprising an elongate crucible arranged to contain a source of material, a heater to heat the source to generate the feed gas, and a cooling duct arranged along a substantial portion of the length of the crucible to receive cooling fluid and cool the source of material.

By circulating cooling fluid around the duct extending along the crucible, more effective and uniform cooling is provided. The present invention also allows the vaporiser to be operated at a lower temperature by running the heater at or close to full power while circulating a controlled amount of cooling fluid through the cooling duct. Thus, the vaporiser according to the present invention can be used with species which sublimate at lower temperatures than those commonly used in implant systems.

In order to optimise the uniformity of the cooling, the cooling duct preferably extends along substantially the entire length of the crucible. The duct is also preferably wound around the crucible and is preferably wound in a helical configuration, as this provides a simple way of achieving the optimum cooling.

BRIEF DESCRIPTION OF THE DRAWINGS

An example of a vaporiser in accordance with the present invention will now be described with reference to the accompanying drawings, in which.

DETAILED DESCRIPTION OF THE PREFERRED EMBODIMENTS

The vaporiser comprises a crucible 1 which generally has a hollow cylindrical shape. The inside of the crucible 1 defines a cavity 2 which is arranged to receive a solid off the appropriate species for the gas to be generated. One end 3 of the cavity 2 is open and is connected, in use, to an ion source located within the ion implant system. A suitable seal (not shown) is provided at the second end 4 of the crucible, so that, in use, the crucible is in a vacuum chamber, while the remainder of the assembly is open to the atmosphere.

Figure 4:
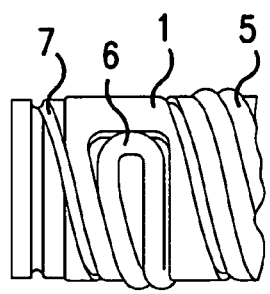
FIG. 4 shows the detailed ringed as IV in FIG. 3.

Around the outer surface of the crucible is a cooling duct 5 helically wound along the entire length of the crucible 1. The helix is shown in a double wound configuration in the figures. One of these windings represents a duct which transports incoming coolant along the crucible from right to left as shown in the figures. While the other duct returns the coolant in the opposite direction. A bend 6 in the duct 5 (as best shown in FIG. 4) represents the transition from the outward duct to the return duct.

A heating element 7 in the form of a thin electrically conductive wire in an insulating housing is helically wound along a groove 8 in the outer surface of the crucible 1. The heating element 7 has the same pitch as the cooling duct 5 but is offset along the axis of the crucible 1.

Leading away from the second end 4 of the crucible 1 is a support tube 9 which terminates at a base plate 10 by which the vaporizer is mounted. Coolant feed and return pipes 11 extend through the support tube 9 and lead respectively to and from the helically wound cooling duct 5. Behind the support plate 10, the coolant return tube 11 is provided with a loop 12 to accommodate any thermal expansion. A lead 13 extends from the heating element 7 through the support tube 9 to an electrical connector 14.

Figure 1:
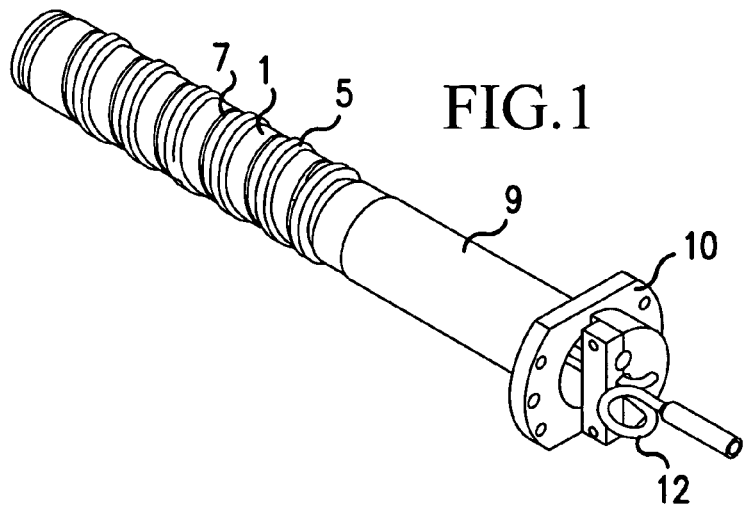
FIG. 1 is a perspective view of the vaporiser.
Figure 2:
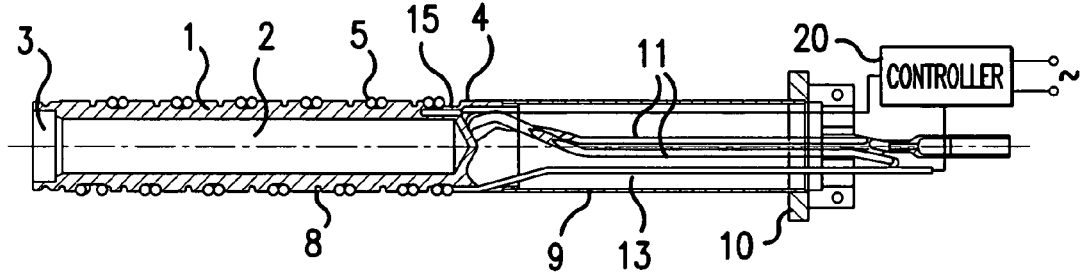
FIG. 2 is a cross-section through line II—II in FIG. 3.
Figure 3:
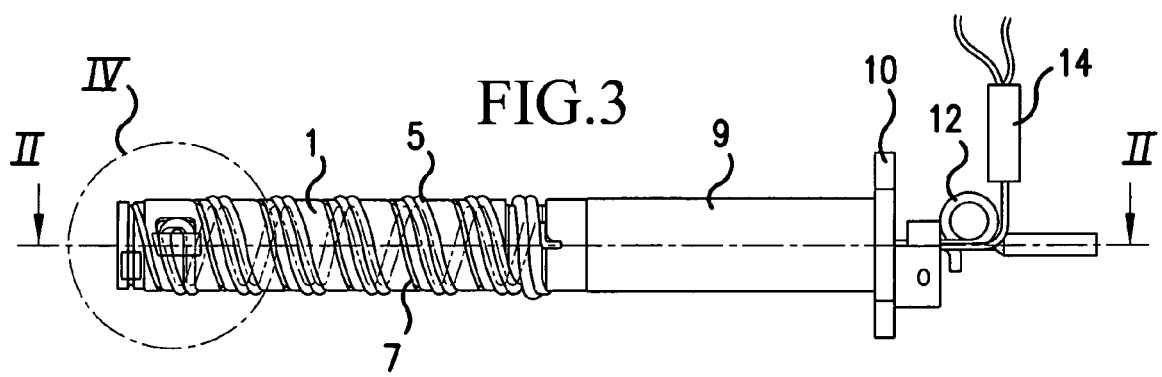
FIG. 3 is a plan view of the lower side of the vaporiser shown in FIG. 1.

The temperature within the crucible is monitored by a thermocouple mounted on the atmospheric side of the vaporiser in a bore 15 at the second end 4 of the crucible 1 as best shown in FIG. 2.

In use, when the assembly is fitted to an ion source, current supplied to the heater element 7 is arranged to maintain the solid source in the chamber 2 at a temperature which is just below that required for sublimation of the solid. When an ion beam of this species is required, the control system 20 increases the power to the heating element 7 raising the vaporiser temperature so that the feed undergoes sublimation and the temperature is then maintained at a level sufficient to give the required vapour flow to the ion source arc chamber. Normally the heating element 7 is energised with a heating current intermittently from a fixed electrical supply, and the mean power delivered to the element 7 is controlled by increasing or reducing the proportion of time during which the element 7 is energised.

When a beam of a different species is required, it is desirable to remove the current species from the arc chamber as quickly as possible. At this time, the power to the heater element 7 is disconnected and a coolant gas such as nitrogen is circulated around the helically wound cooling duct 5 thereby quickly halting sublimation of the solid.

If the vaporiser is required to operate at a lower temperature, a small quantity of coolant gas can be allowed to flow through the cooling duct 5 while current is supplied to the heating element 7. This forced cooling of the crucible 1 during application of the heating current to the heating element 7 has the effect of increasing the thermal loading of the crucible, so that a relatively lower temperature can then be maintained with the heating element 7 energised for a relatively higher proportion of the time. This allows the vaporiser to operate stably at a lower temperature as the temperature can now be more smoothly regulated.

What is claimed is:

1. A method of controlling the generation of a feed gas for the arc chamber of an ion source, comprising the steps of
    a) providing a crucible a quantity of non gaseous material which can be heated to generate a desired feed gas for the arc chamber,
    b) heating the crucible to a temperature at which said desired feed gas is generated, the feed gas being generated by the heating of the crucible, and supplying the generated feed gas to the arc chamber, and
    c) stopping the supply of said desired feed gas by halting said heating and applying forced cooling to said crucible.

* * * * *